United States Patent [19]

Shergov et al.

[11] 4,082,938
[45] Apr. 4, 1978

[54] THERMIONIC HEATER CATHODE ASSEMBLY OF ELECTRON-BEAM GUN

[76] Inventors: Igor Vladimirovich Shergov, Festivalnaya ulitsa, 75, kv. 108; Vladimir Danilovich Slavinsky, Kharkovskaya ulitsa, 1, korpus 4, kv. 767; Lev Moiseevich Fridlender, Volgogradsky prospekt, 157, korpus 2, kv. 37; Valery Ivanovich Zharinov, Vrachebny proezd, 10, korpus 1, kv. 175; Arkady Filippovich Kozhaev, ulitsa 26 Bakinskikh komissarov, 18, korpus 6, kv. 28, all of Moscow, U.S.S.R.

[21] Appl. No.: 795,507

[22] Filed: May 10, 1977

[51] Int. Cl.² ............................................. B23K 9/00
[52] U.S. Cl. ........................... 219/121 EB; 313/337; 313/346 R
[58] Field of Search ............................ 313/346 R, 337; 219/121 EB, 121 EM

[56] References Cited

U.S. PATENT DOCUMENTS 3,500,454    3/1970    Emerick ..................... 313/337

*Primary Examiner*—J. V. Truhe
*Assistant Examiner*—Fred E. Bell
*Attorney, Agent, or Firm*—Fleit & Jacobson

[57] ABSTRACT

A thermionic heater cathode assembly for an electron-beam gun, comprising a disc cathode made of a highly-emissive material and disposed near a metal ribbon filament the thermionic portion whereof has a W shape, the distance between two apices of said thermionic portion being 0.6 to 0.8 of the disc cathode diameter and the depth of the valley between the apices constituting 0.5 to 0.6 of said diameter.

1 Claim, 3 Drawing Figures

THERMIONIC HEATER CATHODE ASSEMBLY OF ELECTRON-BEAM GUN

The present invention relates to electron-beam engineering equipment wherein a high-energy electron beam is employed as a working tool, and more specifically, to a thermionic heater cathode assembly of an electron-beam gun whose cathode made of a highly-emissive material is heated by a filament.

The term "electron-beam gun" applies to plurality of electrodes which produce and define an electron beam, and which can also control its intensity. Said electron-beam gun is connected to a high-voltage DC power source.

The present invention provides a means for welding, fusion and other metal working processes relating to electron-beam engineering.

Previously electron-beam gun heater cathode assemblies were designed along the same lines as conventional thermionic devices, such as electron and cathode-ray tubes. These devices incorporate a cathode heater normally made as a filament wherethrough current is supplied for heating the cathode to a working temperature (700° to 850° C). The filament is enclosed in the cathode fashioned as a metal sheet coated with an oxide layer which emits electrons. The filament varies in shape from coiled (for heater voltages of 2.5 to 4 V) to folding with a plurality of taps and coils (for voltages of 6.3 to 12.6 V), to double-wound (for voltages of 50 V upward), and so on.

Experience has shown that it is preferable to use flat cathodes made of highly-emissive materials in the form of a disc, one side whereof is emitting and the other is heated by electron bombardment and by radiation of a heater part, e.g., heater.

To provide for uniform heating of the cathode, a heater has been designed in the form of a flat coil of tungsten wire.

Our experience shows that since power dissipated by the heater is high, even minor variations in correct geometrical shape of the coil as well differences in turn-to-turn distances occurring in assembly and during operation lead to non-uniform cathode heating, cathode temperature fluctuations during operation, and failure of the cathode surface due to a high temperature gradient.

Commonly known are attempts to provide special insulators intended to hold the coil and to improve its resistance to deformation with the result that the heater becomes complicated in design. These efforts, however, fail to eliminate the abovementioned disadvantages, affect cooling of the cathode assembly and make it difficult to align the heater relative to the cathode during replacement.

Further development of thermionic heater cathode assemblies involves the use of metal ribbon filaments with a resistance to deformation higher than that exhibited by wire heaters.

However, such filaments drain much power to reach the desired heating temperature, and their service life is rather short due to the high density of the current flowing there through.

Recent inventions were aimed at providing a metal ribbon filament with high operating efficiency and stable alignment thereof relative to the cathode surface. Ribbon filaments fabricated from a hard-melting metal and shaped according to the cathode configuration satisfy the above requirements to a certain extent.

The higher the power of the electron-beam gun and the cathode operating temperature, and the smaller the size of the cathode assembly, the more heat is radiated into the surrounding space. As the temperature rises, the insulation strength of the cathode assembly drops, and high-voltage break-downs occur.

It is an object of this invention to provide a thermionic heater cathode assembly with a metal ribbon filament ensuring local heating when electron-beam guns are operated under industrial conditions.

Another object of the present invention is to provide a metal ribbon filament featuring high resistance to deformation and ensuring uniform heating of the cathode surface with minimum power consumed.

These objects are attained in a thermionic heater cathode assembly of an electron-beam gun, comprising a disc cathode made of a highly-emissive material and a metal ribbon filament the thermionic portion thereof is given, according to the invention, a W shape, the distance between the two apices being 0.6 to 0.8 of the emitting disc cathode diameter and the depth of the valley between the apices being 0.5 to 0.6 of said diameter. An important feature of this invention is that the metal ribbon filament incorporating a W-shaped thermionic portion permits troublefree operation in the temperature range of 1,800 to 2,000° C for 8 hours. Besides, the heating power does not exceed 75 W, and the electron-beam gun power is 60 kW.

Other objects and advantages of the present invention will become more fully apparent from the following detailed description of a preferred embodiment thereof, taken in conjunction with the accompanying drawings, wherein.

Figure 1:
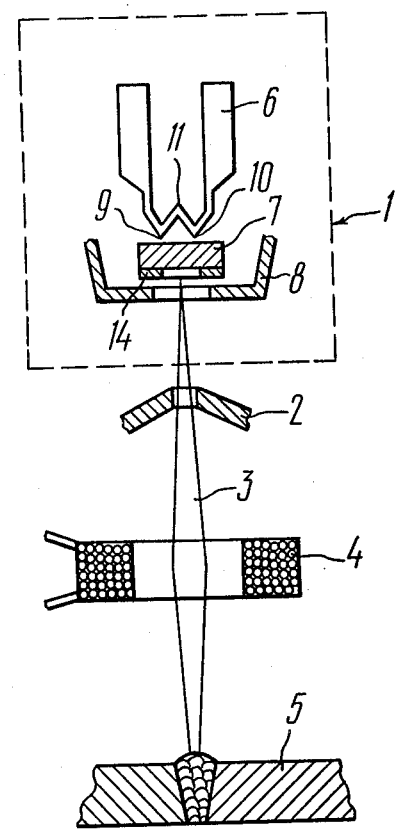
FIG. 1 is a schematic diagram of an electron-beam gun incorporating a thermionic heater cathode assembly, according to the invention, with a workpiece to be welded.

The electron-beam gun is a metal welding machine (not shown) comprises a thermionic heater cathode assembly 1 (FIG. 1) and an anode 2 disposed thereunder, serving to produce an electron beam 3. An electromagnetic lens 4 is arranged downstream of the anode 2 in the direction of the electron beam. A workpiece 5 to be welded is positioned downstream of the electromagnetic lens 4 in the direction of the beam.

The thermionic heater cathode assembly 1 comprises a metal ribbon filament 6 with a W-shaped thermionic portion made of tantalum. A disc cathode 7 placed beside the metal ribbon filament is made of lanthanum hexaboride ($LaB_6$) and is axially aligned with a control electrode 8.

The function of the control electrode 8 is to regulate the current from the disc cathode 7.

Figure 2:
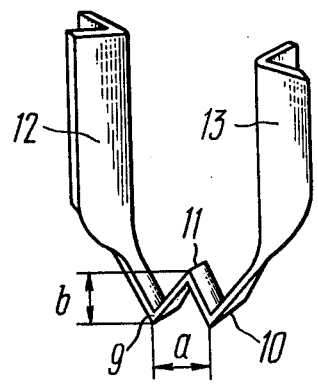
FIG. 2 is an enlarged axonometric view of the metal ribbon filament.

The W-shaped thermionic portion of the metal ribbon filament 6 serving to increase the resistance to deformation and to accumulate thermal energy in the central section of the disc electrode 7, has the following dimensions. Adjacent apices 9 and 10 (FIG. 2) of the W-shaped portion of the metal ribbon filament 6 are spaced appart at distance "a" constituting 0.6 to 0.8 of the diameter of the disc cathode 7 (FIG. 1). The depth of the valley in the metal ribbon filament thermionic portion, i.e., distance "b" between an apex 11 (FIG. 2) and the apices 9 and 11 is 0.5 to 0.6 of the diameter of the disc cathode 7. Ends 12 and 13 of the metal ribbon filament 6 are V-shaped in cross section for a further increase in the resistance to deformation of the filament.

Figure 3:
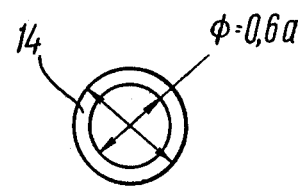
FIG. 3 is a schematic view of the screen coating.

The thermionic surface of the disc cathode 7 has a screen coating 14 (FIG. 1) of tantalum which exhibits an electronic work function higher than that of lanthanum hexaboride used as the material of the disc cathode 7. The screen coating 14 can be applied by vacuum deposition of tantalum the disc cathode 7, although the use of tantalum foil having a thickness of 0.01 to 0.1 mm is possible. The screen coating 14 is made in the form of a flat ring (FIG. 3), the inner diameter thereof being 0.6 of the distance "a" (FIG. 2) between the adjacent apices of the thermionic portion of the metal ribbon filament 6.

In the electron-beam gun incorporating the thermionic heater cathode assembly, a thin focused beam 3 of electrons moving at a high velocity is directed onto the workpiece 5 to be welded (FIG. 1), placed into a vacuum chamber (not shown). The high-energy electron beam applied to the workpiece heats and melts its metal. Free electrons are produced by the disc cathode 7 heated under bombardment by the beam of electrons from the W-shaped thermionic portion of the ribbon filament 6. The heating temperature rises to 2,200° C. The disc cathode 7 has a positive potential of 1.2 kV relative to the metal ribbon filament 6, with the result that the velocity of electrons increases as well as the intensity of electron bombardment of the disc cathode 7. The disc cathode 7 is heated both by the heat radiated by the metal ribbon filament 6 and by the impact of electrons against the body of the disc cathode 7. Owing to the high temperature of radiation and to electron bombardment, the metal of the disc cathode 7 starts evaporating, and as it reaches the thermionic portion of the metal ribbon filament 6, activates said portion and reduces the electronic work function of the filament.

The best results have been achieved by maintaining a definite ratio between the W-shaped thermionic portion dimensions in the metal ribbon filament 6 as mentioned above. The area of the activated W-shaped portion substantially exceeds that of a similar portion in a prior art V-shaped metal ribbon filament. The maximum intensity of the electron beam is reached in the gap between the adjacent apices 9 and 10 of the W-shaped portion. Besides, uniform heating is ensured essentially in the central part of the disc cathode 7.

filament 6 permits reducing the power drained by the filament by 30 percent as against the power consumed by the V-shaped ribbon filament, and the lantahnum hexaboride coating of the W-shaped thermionic portion provides for the desired emission at a temperature of 1,800° C, whereas non-activated tantalum requires a temperature of 2,200° C to reach the same emission rate. Owing to the lower temperature of the metal ribbon filament 6, its service life is 10 times longer than that of the prior art V-shaped filament.

The screen coating 14 of the above-mentioned shape, applied to the emitting surface of the disc cathode 7, permits reducing the temperature gradient across the cathode 7, hence, preventing structural changes and cracking of the metal of which the disc cathode is made. The electron emission is more uniform, and the electron density across the beam can be predetermined by virtue of low-energy scattered peripheral electrons being excluded from the beam. Consequently, the variation in the width of fusion in the metal heated by the beam is 10 times as low as that observed when no screen coating 14 is employed.

The high electron energy developed in the electron-beam gun is reached through accelerating the electrons by a high-voltage field produced by the anode 2. The velocity of the electrons moving toward the workpiece 5 being welded is almost equal to that of light.

The diameter of the beam 3 passing through a centring system (not shown) and through the magnetic lens 4 can be reduced to hundredths and even thousandths of a millimeter, hence, the specific power can be elevated to several thousand kW/sq.mm.

The energy is supplied in pulses having a duration of $10^{-4}$ to $10^{-6}$ sec. On impact of the electron beam with the surface of the workpiece 5 being welded, the electron energy is converted to heat. As a result, heating is localized to a high degree. While the temperature in the area of direct contact of the beam with the workpiece (contact spots) reaches 3,000° and even 4,000° C, at a distance of only 1 micron from this area it does not exceed 300° C. Under such conditions of heat transfer to the metal being welded, and due to a high beam power, the welding time may be reduced considerably.

The operating conditions of the electron-beam gun incorporating the thermionic heater cathode assembly 1, according to the invention, are specified in the table below.

| Distance multiple of disc cathode diameter | | Temperature gradient across disc cathode thermionic surface, deg/mm | | Power consumed by ribbon filament at 2200° C, W | Disc cathode bombardment, voltage, V | Disc cathode bombardment current, mA | Cathode assembly holder temperature, ° C | Operating time, hr |
|---|---|---|---|---|---|---|---|---|
| a | b | portion without coating | coated portion | | | | | |
| 0.6 | 0.5 | 20 | 150 | 70 | 1,000 | 30 | 200 | 24 |
| 0.7 | 0.55 | 25 | 160 | 72 | 1,100 | 25 | 230 | 23 |
| 0.8 | 0.6 | 30 | 180 | 75 | 1,200 | 20 | 260 | 22 |
| 0.85 | 0.3 | 80 | 240 | 120 | 1,300 | 40 | 350 | 3 |

The apex 11 being at distance "b" from the apices 9 and 10 of the W-shaped thermionic portion permits increasing the area of the thermionic portion of the metal ribbon filament 6 and maintaining the thermal balance of the disc cathode 7. It is not desirable to reduce distance "b" because this may lead to failure of the disc cathode 7 resulting from overheating of the central part thereof. An increase in the distance "b" leads to a substantial loss in the efficiency of the thermionic heater cathode assembly 1. The design of the metal ribbon A substantial increase in the electron beam power permits the use of the welding machine even without a vacuum chamber, and this feature is essential in welding of certain workpieces directly during assembly. Such welding is possible due to the rather small dimensions of the electron-beam gun, the electron beam intensity whereof is as high as that of known installations which are twice as large as the gun of the present invention.

What is claimed is:

1. A thermionic heater cathode assembly of an electron-beam gun comprising: a disc cathode made of a highly-emissive material; a metal ribbon filament of the cathode, with a thermionic portion disposed near said disc cathode; said thermionic portion having a W shape, the distance between two apices being 0.6 to 0.8 of the diameter of said disc cathode and the depth of the valley between the apices being 0.5 to 0.6 of said diameter.

* * * * *